United States Patent [19]

Beisswenger

[11] Patent Number: 4,500,791
[45] Date of Patent: Feb. 19, 1985

[54] HIGH STABILITY ELECTRON BEAM GENERATOR FOR PROCESSING MATERIAL

[75] Inventor: Siegfried Beisswenger, Preetz, Fed. Rep. of Germany

[73] Assignee: Dr. -Ing. Rudolf Hell GmbH, Fed. Rep. of Germany

[21] Appl. No.: 348,064
[22] PCT Filed: Jun. 7, 1980
[86] PCT No.: PCT/DE80/00086
§ 371 Date: Feb. 8, 1982
§ 102(e) Date: Feb. 8, 1982
[87] PCT Pub. No.: WO81/03579
PCT Pub. Date: Dec. 10, 1981
[51] Int. Cl.³ .................. H01J 3/02; H01J 37/063
[52] U.S. Cl. .................. 250/493.1; 250/492.3; 313/448
[58] Field of Search .................. 313/447, 448; 250/493.1, 492.3; 219/121 ET

[56] References Cited

U.S. PATENT DOCUMENTS 3,846,660 11/1974 Wolfe et al. .................. 313/448

FOREIGN PATENT DOCUMENTS 1062831 8/1959 Fed. Rep. of Germany ...... 378/110

OTHER PUBLICATIONS

*Reference Data for Radio Engineers*, Fourth Edition, International Telephone and Telegraph Co., 1956, pp. 367–369.

Primary Examiner—Alfred E. Smith
Assistant Examiner—T. N. Grigsby
Attorney, Agent, or Firm—Hill, Van Santen, Steadman & Simpson

[57] ABSTRACT

Apparatus for generating and controlling an electron gun in a vacuum envelope comprising, a cathode, means for controlling the temperature of the cathode to control its current emission, an auxiliary electrode with an aligned opening mounted adjacent to said cathode and with the electron beam from the cathode passing through said aligned opening, means for maintaining the voltage of said auxiliary electrode slightly more negative than said cathode, and an annular anode mounted in a spaced relationship from said cathode and said auxiliary electrode.

6 Claims, 3 Drawing Figures

HIGH STABILITY ELECTRON BEAM GENERATOR FOR PROCESSING MATERIAL

BACKGROUND OF THE INVENTION

1. Technical Field

The invention relates to a high stability electron beam generator for processing material, comprising an electrically heated cathode, a perforated anode, and a control electrode lying at a potential which is more positive than the cathode and disposed between the cathode and the anode.

2. Underlying Prior Art

In the known electron beam generating system for processing material, the electron beam is generated and controlled by three electrodes, cathode, perforated anode and Wehnelt cylinder. Directly or indirectly heated H-needle, ribbon- or bolt-cathodes consisting of tungsten are employed as the cathode and cathodes consisting of lanthanhexaborate are also employed.

The electrons of the electron beam are emitted from the cathode due to the heating and are subsequently accelerated. For example, the cathode can be charged with a high negative voltage, whereas the anode lies at grounded potential. The electrodes are accelerated toward the anode in the electrical field generated in that manner, pass through the anode perforation and arrive in the field-free space.

In the previous systems, the third electrode, the Wehnelt or lattice electrode, serves for controlling the current of the beam. The function of the Wehnelt electrode is described, for example, in the publication M. Blocke, Zeitschrift für angewandte Physik, Vol. 3, 1951, pp. 441 through 449, "Elementare Theorie der Elektronenstrahlerzeugung mit Trioden-systemen".

When the negative voltage of the Wehnelt electrode is increased beyond a specific value, then further electrons are incapable of leaving the cathode surface, i.e., there are no electrical field vectors which accelerate the electrons to the anode directed to the anode at the cathode surface. The emission is blocked. When the Wehnelt voltage is reduced, then the anode penetration coefficient increases. Given a decreasing Wehnelt voltage, larger and larger areas of the cathode are released for emission, whereby the emission current increases. Thus, the variable negative voltage of the Wehnelt cylinder in comparison to the cathode allows a control of the beam current.

A characteristic of these systems is described in greater detail below. It derives from the structural disposition of the Wehnelt cylinder and due to the prescribed Wehnelt voltage which is required for setting a desired beam current, a fixed beam geometry which can only be changed by means of changing the structural shape or the Wehnelt voltage. However, a change of the Wehnelt voltage again leads to a change of the beam current. This rigid dependency of the beam current upon the Wehnelt voltage and the beam shape fixed by the Wehnelt arrangement and Wehnelt voltage are disadvantageous.

Added thereto as a further disadvantage is that, in the standard operating mode, the cathode is operated in the space charge range, whereby the beam value lies below the value which would theoretically derive given operation of the cathode in the saturation range. Resulting therefrom is that the efficiency of the electron beam generator does not assume the optimally attainable value.

SUMMARY OF THE INVENTION

It is therefore the object of the present invention to create an electron beam generator which does not exhibit these disadvantages and which has a higher beam value in comparison to known electron beam generators.

Thus, the invention consists of an electron beam generating system with a heated cathode, a perforated anode, and an auxiliary electrode lying at a more negative potential than the cathode, and is characterized in that the beam current is determined by means of rating the active surface of the cathode and by means of the controlled heating of the cathode to a constant temperature.

An advantageous further development consists therein that the auxiliary electrode surrounds the cathode and lies at a slightly more negative, constant potential than the cathode. In an advantageous manner, the auxiliary electrode is designed as a perforated disk surrounding the cathode. According to an advantageous further development, the structure is undertaken in such manner that the surface of the auxiliary electrode pointing toward the anode aligns with the surface of the cathode pointing toward the anode. Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

In the following, the invention is described in greater detail on the basis of FIGS. 1 through 3. There are shown.

DESCRIPTION OF THE PREFERRED EMBODIMENTS

Figure 1:
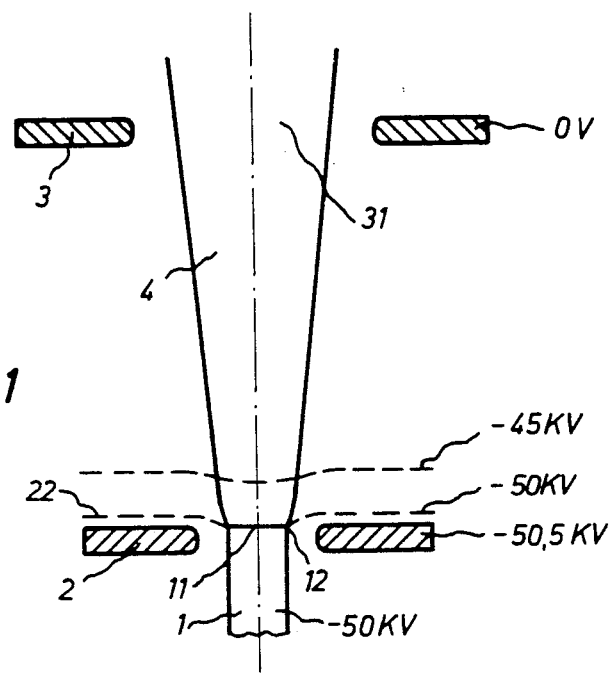
FIG. 1 an example of the disposition of the electrodes of the electron beam generating system and of the beam geometry of the electron beam.

In FIG. 1, a schematically illustrated cathode 1 is surrounded by an annular auxiliary electrode 2. The auxiliary electrode 2 lies at a somewhat more negative potential than the cathode 1. When the cathode 1 is heated, then it predominantly emits an electron beam 4 from its surface 11, said electron beam 4 moving in the direction of a perforated anode 3 and passing through the anode perforation 31.

Let approximately the following voltages be adjacent to the individual electrodes: cathode $-50$ KV, auxiliary electrode $-50.5$ KV and anode 0 V.

An equipotential surface of the potential of the cathode surface is referenced with the reference numeral 22, and one can see that it slightly increases proceeding from the edge 12 of the cathode surface 11 in order to again assume a constant progress across the auxiliary electrode 2. What is thereby achieved is that no electrons which emerge from the lateral surfaces of the cathode contribute to the beam.

In conjunction with the heating of the cathode to a constant temperature, an optimum power exploitation of the system is achieved by means of this disposition of cathode and auxiliary electrode, whereby the influence of the auxiliary electrode 2 is additionally usable as a free parameter for the beam shaping, this to be explained in greater detail below.

It is possible to operate the cathode in saturation by means of the potential path indicated in FIG. 1. All electrons are then directly suctioned from the cathode surface, since the potential difference between the cathode and the anode generates an electrical field which becomes effective at the cathode surface nearly without attenuation.

Unlike known arrangements, a space charge zone is not formed above the cathode. The reasons for this space charge zone in known arrangements lies therein that, given a dimensioning of the emission surface of the cathode which is not precise, it is necessary to apply a relatively high negative potential to the Wehnelt electrode for the control of the beam current. Thereby, the draw-off field strength in front of the cathode is greatly reduced. In this case, a space charge zone consisting of electrons is formed in front of the cathode. The anode-side surface of this space charge zone now functions as the actual electron source. Since the emission surface of the space charge zone is always greater than the active surface of the cathode itself, the emission density in these systems is lower, i.e., the beam value is poorer.

Figure 2:
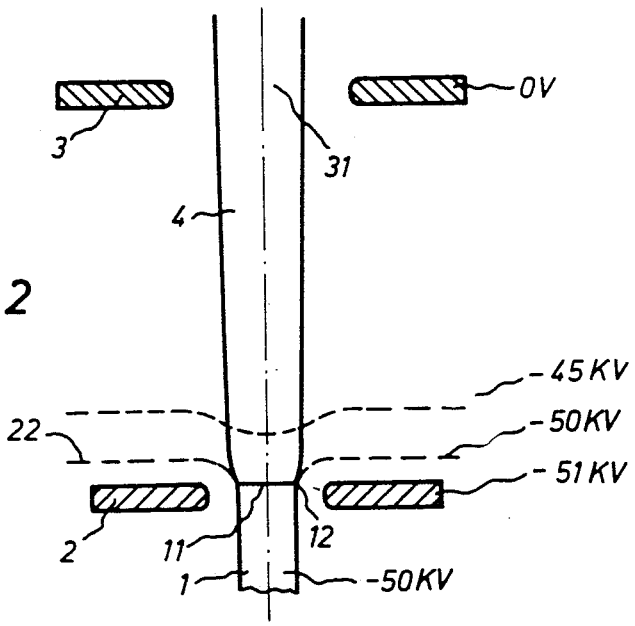
FIG. 2 a further example of the beam geometry of the electron beam.

FIG. 2 shows an example as to how, given retention of the optimum exploitation of the beam energy, an altered shaping of the beam ensues by means of the auxiliary electrode 2. Since FIG. 2 is a matter of the same structural parts as in FIG. 1, the same reference numerals have been employed. In contrast to FIG. 1, the potential of the auxiliary electrode 2 has been selected somewhat more negative, namely, at −51 KV, for example. One can see that the curve of the −50 KV line 22 between the cathode and auxiliary electrode proceeds more steeply than in FIG. 1. This leads to the fact that the electrons emerging from the cathode are focused into a slimmer electron beam.

Thus, by means of setting the voltage of the auxiliary electrode, it is possible in a simple manner to alter the beam geometry of the electron beam without the current intensity being altered.

In saturation mode, the emission current of a cathode surface of a specific size only depends on the cathode temperature. In order, thus, to set a specific current intensity of the electron beam in the present case, the cathode heating power is regulated in such manner that the cathode constantly exhibits the temperature appertaining to the desired current intensity.

Figure 3:
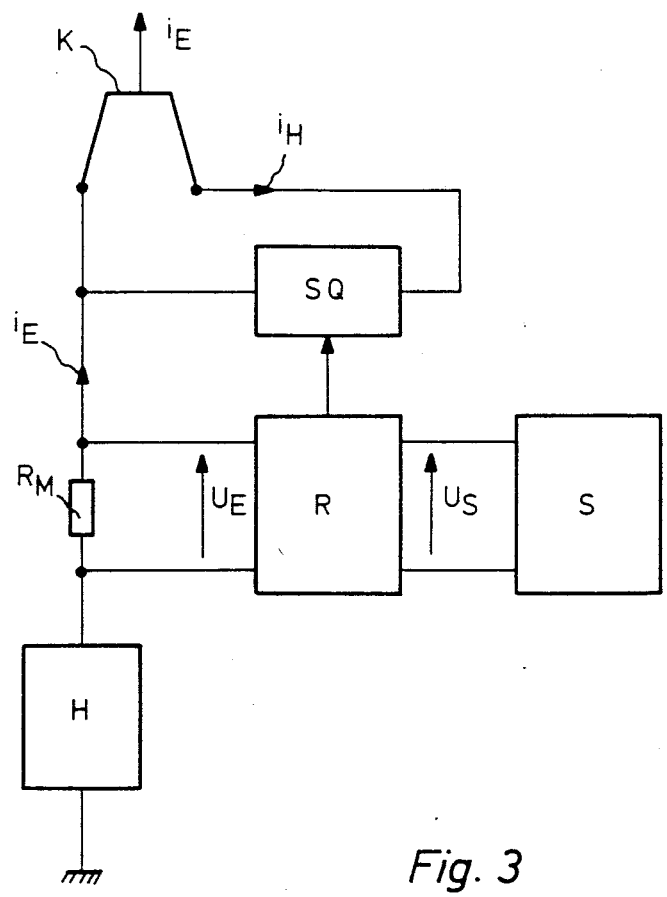
FIG. 3 a circuit arrangement for heating the cathode.

A schematic circuit for holding the cathode temperature constant given a directly heated cathode is specified in FIG. 3.

The emission current $i_E$ flows from the high voltage generator H across the current precision resistor RM to the cathode K. The voltage UE proportional to the emission current drops off at the precision resistor. A voltage US proportional to the desired beam current is generated in the rated value generator S. The voltages US and UE are supplied to the regulator R. The regulator R sets the voltage source SQ of the heater circuit to the cathode K in such manner that UE becomes UE=US, i.e., the cathode emits the constant current $i_E$, whereby a constant cathode temperature is observed because of the clear interrelationship between the emission current and the cathode temperature.

A further advantage of the invention becomes clear as the result of a comparison to a traditional system:

Since, in a traditional system, the beam current is controlled by means of the Wehnelt voltage, the heating capacity must be set in such manner that the cathode assumes a higher temperature than would be necessary for attaining the desired beam current. However, the cathode resistance RK varies during the useful life of the cathode due to evaporation of cathode material. When the cathode is heated with constant current, then the cathode heating capacity increases and, thus, the cathode temperature constantly increases according to the equation for constant-current heating capacity $N_H$ $$N_H = i_H^2 \cdot R_K$$

Accordingly, the cathode temperature decreases with the heating capacity given constant-voltage heating according to the equation $$N_H = U_H^2 / R_K$$

The change of the cathode temperature as the result of aging, however, causes a change of the emission efficiency of the cathode. A constant beam current can be observed by means of controlling the Wehnelt voltage, but, at the same time, the necessary changes of the Wehnelt voltage effect a change of the beam geometry.

These disadvantages are avoided in the inventive arrangement since the Wehnelt voltage once set in order to achieve a favorable beam shape is not altered, since the heating capacity is controlled during the life-expectancy of the cathode in such manner that the cathode always exhibits the same temperature.

Commercial Utilization

The invention can be advantageously employed in processing material with electron beams in which high energy density and a precise beam shape are a matter of concern.

A further area of application lies in the production of printing forms by means of an electron beam, whereby the cups required for the printing operation are engraved from the surface of the printing form with the electron beam.

Moreover, the invention can be applied in electron beam microscopy. Although the invention has been described with respect to preferred embodiments, it is not to be so limited as changes and modifications can be made which are within the full intended scope of the invention as defined by the appended claims.

I claim:

1. An electron beam generating system comprising a heated cathode, a perforated anode spaced from said cathode, an auxiliary electrode surrounding the cathode and the electron beam shape and the beam intensity are determined because a slightly more negative constant voltage is applied to the auxiliary electrode than is applied to the cathode, means for controlling the heating of the cathode to a constant temperature, including means for measuring the actual emission current of the cathode and supplying an output to said means for controlling the heating current of the cathode.

2. An electron beam generating system according to claim 1 wherein said auxiliary electrode is a perforated disk which surrounds said cathode.

3. An electron beam generator according to claim 2 wherein the planar surface of said cathode facing said anode is aligned with the planar surface of the auxiliary electrode which faces said anode.

4. Apparatus for generating and controlling an electron gun in a vacuum envelope comprising, a cathode with an active end surface and a heater, an annular anode mounted in a spaced relationship from said cathode, an auxiliary electrode with an aligned opening mounted adjacent to said cathode and with the electron beam from the cathode controlled by said auxiliary electrode, means for maintaining the voltage of said auxiliary electrode slightly more negative than said cathode, means for controlling the heating current of the cathode to a constant temperature connected to the heater of said cathode, means for measuring the actual emission current of the cathode connected to supply an output to said means for controlling the heating current of the cathode.

5. Apparatus according to claim 4 wherein said auxiliary electrode comprises a planar disk member with said aligned opening surrounding the electron surface of said cathode.

6. Apparatus according to claim 5 including a high voltage generator, said means for measuring the actual emission current of the cathode comprising a current precision resistor connected to said high voltage generator and to said cathode and measuring the emission current of said cathode, a regulator connected to said current precision resistor, a variable voltage source connected to said regulator to supply a voltage proportional to the desired beam current, and a voltage source connected to said cathode and receiving an input from said regulator for controlling the heating current of said cathode.

* * * * *